US010297688B2

(12) United States Patent
Cheng et al.

(10) Patent No.: US 10,297,688 B2
(45) Date of Patent: May 21, 2019

(54) VERTICAL FIELD EFFECT TRANSISTOR WITH IMPROVED RELIABILITY

(71) Applicant: International Business Machines Corporation, Armonk, NY (US)

(72) Inventors: Kangguo Cheng, Schenectady, NY (US); Xin Miao, Guilderland, NY (US); Philip J. Oldiges, Lagrangeville, NY (US); Wenyu Xu, Albany, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/966,232

(22) Filed: Apr. 30, 2018

(65) Prior Publication Data

US 2018/0277675 A1 Sep. 27, 2018

Related U.S. Application Data

(62) Division of application No. 15/468,300, filed on Mar. 24, 2017.

(51) Int. Cl.
*H01L 29/78* (2006.01)
*H01L 29/66* (2006.01)
(Continued)

(52) U.S. Cl.
CPC ...... *H01L 29/7827* (2013.01); *H01L 29/0649* (2013.01); *H01L 29/0847* (2013.01); *H01L 29/66666* (2013.01)

(58) Field of Classification Search
CPC ............. H01L 29/7827; H01L 29/0649; H01L 29/0847; H01L 29/66666
See application file for complete search history.

(56) References Cited

U.S. PATENT DOCUMENTS 7,241,655 B2 * 7/2007 Tang ................. H01L 27/10876 257/E21.411
2003/0119237 A1 * 6/2003 Chittipeddi ..... H01L 21/823885 438/199
2017/0103977 A1 * 4/2017 Li ..................... H01L 21/26513

OTHER PUBLICATIONS

Cheng et al., "Vertical Field Effect Transistor With Improved Reliability," U.S. Appl. No. 15/468,300, filed Mar. 24, 2017.

(Continued)

*Primary Examiner* — Julia Slutsker
(74) *Attorney, Agent, or Firm* — Cantor Colburn LLP; Vazken Alexanian

(57) ABSTRACT

Provided is a method for forming a semiconductor structure. In embodiments of the invention, the method includes forming a semiconductor fin on a source/drain region, forming a liner including a first dielectric material along sidewalls of the semiconductor fin and along sidewalls of the source/drain region, forming a second dielectric material along sidewalls of the liner including the first dielectric material, and removing the liner including the first dielectric material from sidewalls of the semiconductor fin. Removing the liner including the first dielectric material includes exposing portions of the source/drain region. The method further includes forming a spacer layer on the second dielectric material and portions of the source/drain region exposed by removing the liner including the first dielectric material and forming a gate material on the spacer layer.

18 Claims, 6 Drawing Sheets

210 190 210
200
180
100
160
140
130
120
195
Y
X
Z

(51) Int. Cl.
*H01L 29/08* (2006.01)
*H01L 29/06* (2006.01)

(56) References Cited

OTHER PUBLICATIONS

List of IBM Patents or Patent Applications Treated as Related; Date Filed: Apr. 30, 2018, 2 pages.

* cited by examiner

VERTICAL FIELD EFFECT TRANSISTOR WITH IMPROVED RELIABILITY

CROSS-REFERENCE TO RELATED APPLICATION

This application is a divisional of U.S. application Ser. No. 15/468,300, filed Mar. 24, 2017, the contents of which are hereby incorporated by reference in its entirety.

BACKGROUND

The present invention relates in general to vertical field effect transistors (FETs). More specifically, the present invention relates to vertical FETs with improved reliability.

Vertical-type transistors such as vertical FETs (VFETs) can achieve a reduced FET device footprint without compromising FET device performance characteristics. In vertical FETs the source-drain current can flow in a direction perpendicular to a substrate surface. For example, the substrate surface can be made horizontal, and the vertical FET can be a vertical pillar with the drain and source being the top and bottom portion of the pillar.

SUMMARY

One or more embodiments of the invention provide a method for forming a semiconductor structure. A liner is removed from sidewalls of a semiconductor fin. The removal of the liner exposes portions of the source/drain region. A spacer layer is formed on the second dielectric material and portions of the source/drain region that was exposed by removing the liner. A gate material is formed on the spacer layer.

One or more embodiments of the invention provide a semiconductor structure. The semiconductor structure includes a source/drain region, a semiconductor fin on the source/drain region in a first direction, a dielectric material in a shallow trench isolation region, and a spacer layer on the source/drain region and on dielectric material. The dielectric material can be between the source/drain region and the spacer layer in the first direction. The semiconductor structure can further include gate material on the spacer layer and along sidewalls of the semiconductor fin.

One or more embodiments of the invention provide a semiconductor structure. The semiconductor structure includes a source/drain region, a gate region, a first dielectric material, and a liner including a second dielectric material between the source/drain region and the first dielectric material. The liner including the second dielectric material is between the source/drain region and the first dielectric material in a first direction. The source/drain region has a surface closer to the gate region than does the liner including the second dielectric material in the first direction. The second direction is orthogonal to the first direction.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

Figures 1, 2A:
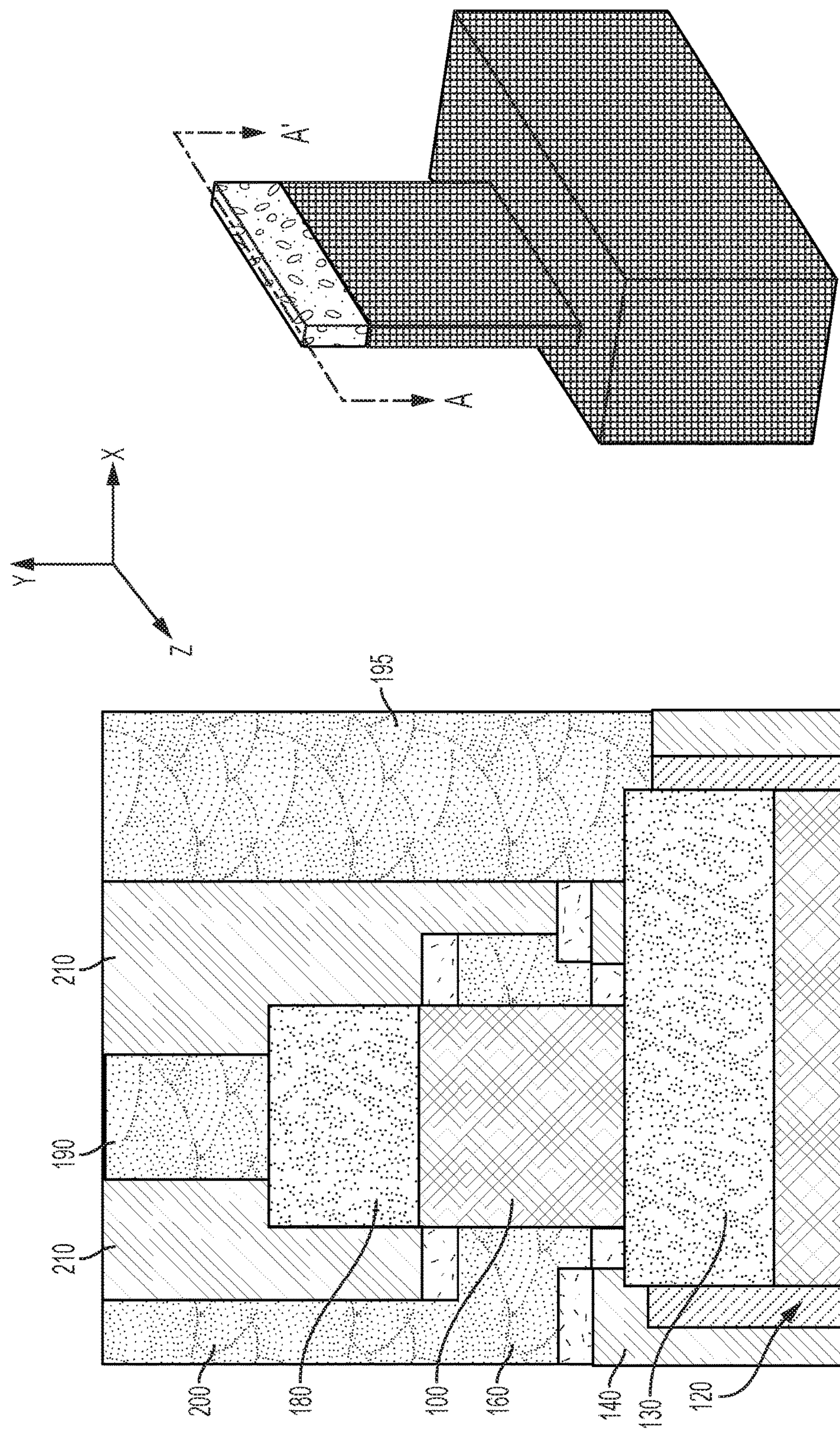
FIG. 1 depicts a cross-sectional view of a semiconductor structure after a processing operation according to one or more embodiments of the present invention.
FIG. 2A depicts a perspective view of a semiconductor structure after a processing operation according to one or more embodiments of the present invention.

Various embodiments of the present invention are described herein with reference to the related drawings. Alternative embodiments can be devised without departing from the scope of embodiments of the present invention. It is noted that various connections and positional relationships (e.g., over, below, adjacent, etc.) are set forth between elements in the following description and in the drawings. These connections and/or positional relationships, unless specified otherwise, can be direct or indirect, and embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well-known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of embodiments of the present invention are unique. Thus, the unique combination of the operations described in connection with the fabrication of a semiconductor device according to embodiments of the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of embodiments of the present invention, directional deposition can be used to deposit a bottom spacer and achieve uniformity of the bottom spacer in a VFET. Directional deposition of the bottom spacer can result in a final structure having a relatively short distance between a gate and a doped bottom source/drain (S/D) region of the VFET, and a relatively high electric field can exist between a gate and the S/D region of the VFET.

Turning now to an overview, one or more embodiments of the invention provide methods and structures configured to improve reliability of a VFET by minimizing or eliminating high electric fields between a gate and an S/D region of the VFET. In one or more embodiments of the invention, the resulting structure can include a stepped bottom spacer and/or a stepped metal gate, and can include a dielectric liner around a bottom S/D region. Methods for forming a semiconductor structure and semiconductor structures in accordance with embodiments of the invention are described in detail below by referring to the accompanying drawings in FIGS. 1-11.

FIG. 1 depicts a cross-sectional view of a semiconductor structure after a processing operation according to one or more embodiments of the invention. As depicted in FIG. 1, the semiconductor structure can include fin 100, dielectric liner 120, doped bottom S/D region 130, shallow trench isolation (STI) structure 140, metal gate stack 160, doped top S/D region 180, top contact 190, bottom contact 195, gate contact 200, and dielectric material 210.

Figure 2B:
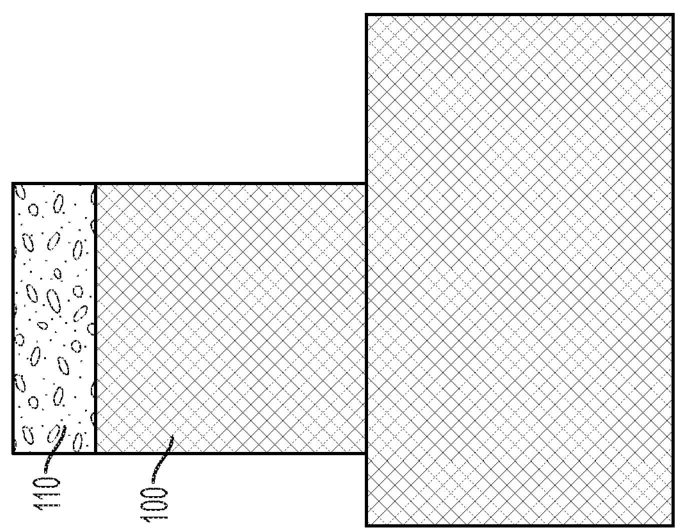
FIG. 2B depicts the semiconductor structure shown in FIG. 2*a* along line A-A'.

FIG. 2*a* depicts a perspective view of a semiconductor structure after a processing operation according to one or more embodiments of the invention, and FIG. 2*b* depicts the semiconductor structure shown in FIG. 2*a* along line A-A'. As depicted in FIGS. 2*a* and 2*b*, a tall, thin vertical semiconductor (e.g., silicon) "fin" 100 can be etched from a semiconductor substrate, and an active region, e.g., a bottom S/D region can be formed.

The semiconductor substrate can be, for example, a bulk semiconductor material such as silicon, or a semiconductor-on-insulator (SOI) substrate including a handle substrate, a buried insulator layer, and a top semiconductor layer. In some embodiments of the invention, the substrate can include a semiconductor material, such as, for example, Si, Ge, SiGe, SiC, SiGeC, and III/V compound semiconductors. The substrate can provide mechanical support to the buried insulator layer and the top semiconductor layer. The thickness of the handle substrate can be, for example, from 30 μm to about 2 mm.

The buried insulator layer can include a dielectric material such as silicon oxide, silicon nitride, silicon oxynitride, or a combination thereof. The thickness of the buried insulator layer can be from 50 nm to 200 nm, for example, from 100 nm to 150 nm.

The top semiconductor layer can include a semiconductor material such as, for example, Si, Ge, SiGe, SiC, SiGeC, and III/V compound semiconductors such as, for example, InAs, GaAs, and InP. The semiconductor materials of the top semiconductor layer and the handle substrate can be the same or different. Each of the handle substrate and the top semiconductor layer can include a single crystalline semiconductor material, such as, for example, single crystalline silicon. In some embodiments, the top semiconductor layer can be doped with p-type dopants and/or n-type dopants. The term "p-type" refers to the addition of impurities to an intrinsic semiconductor that creates deficiencies of valence electrons, and examples of p-type dopants include, for example, boron, aluminum, gallium and indium. "N-type" refers to the addition of impurities that contributes free electrons to an intrinsic semiconductor. The doping can be achieved utilizing ion implantation, gas phase doping, or epitaxy and examples of n-type dopants, include, for example, antimony, arsenic and phosphorous. The thickness of the top semiconductor layer can be from 10 nm to 200 nm, for example, from 30 nm to 70 nm.

In some embodiments of the invention, a hard mask layer 110 can be formed on the top semiconductor layer prior to forming the semiconductor fins 100. The hard mask layer 110 can include an oxide, nitride, oxynitride or any combination thereof including multilayers. In some embodiments of the invention, the hard mask layer 110 can include silicon oxide or silicon nitride. The hard mask layer 110 can be formed utilizing a deposition process such as, for example, chemical vapor deposition (CVD), plasma enhanced chemical vapor deposition (PECVD), chemical solution deposition, evaporation. In some embodiments of the invention, the hard mask layer 110 can be formed by a thermal process such as, for example, oxidation or nitridation of the top semiconductor layer. Any combination of the above mentioned processes can also be used in forming the hard mask layer 110. The hard mask layer 110 can have a thickness from 20 nm to 80 nm, for example, from 30 nm to 60 nm.

The top semiconductor layer can be patterned to form a plurality of vertical semiconductor fins 100. In an embodiment, the semiconductor fins 100 can be formed by lithography and etching. The lithographic step can include applying a photoresist layer atop the hard mask layer 110, exposing the photoresist layer to a desired pattern of radiation, and developing the exposed photoresist layer utilizing a resist developer. The etching process can include dry etching and/or wet chemical etching. Examples of dry etching processes that can be used include reactive ion etching (ME), ion beam etching, plasma etching or laser ablation. The etching process can transfer the pattern from the patterned photoresist layer to the hard mask layer 110 and to the top semiconductor layer, and thereafter to underlying top semiconductor layer utilizing the buried insulator layer as an etch stop. After transferring the pattern into the top semiconductor layer, the patterned photoresist layer can be removed utilizing a resist stripping process such as, for example, ashing. In some embodiments of the invention, the semiconductor fins 100 can also be formed utilizing a sidewall image transfer (SIT) process. In an SIT process, spacers can be formed on a dummy mandrel. The dummy mandrel can be removed and the remaining spacers can be used as a hard mask to etch the top semiconductor layer. The spacers can then be removed after the semiconductor fins 100 have been formed.

Each of the semiconductor fins 100 can have a height ranging from 1 nm to 150 nm, for example, from 10 nm to 50 nm. Each of the semiconductor fins 100 can have a width ranging from 3 nm to 40 nm, for example, from 6 nm to 20 nm. Adjacent semiconductor fins 100 can be separated by a pitch ranging from 20 nm to 100 nm, for example, from 30 nm to 50 nm.

Figure 3:
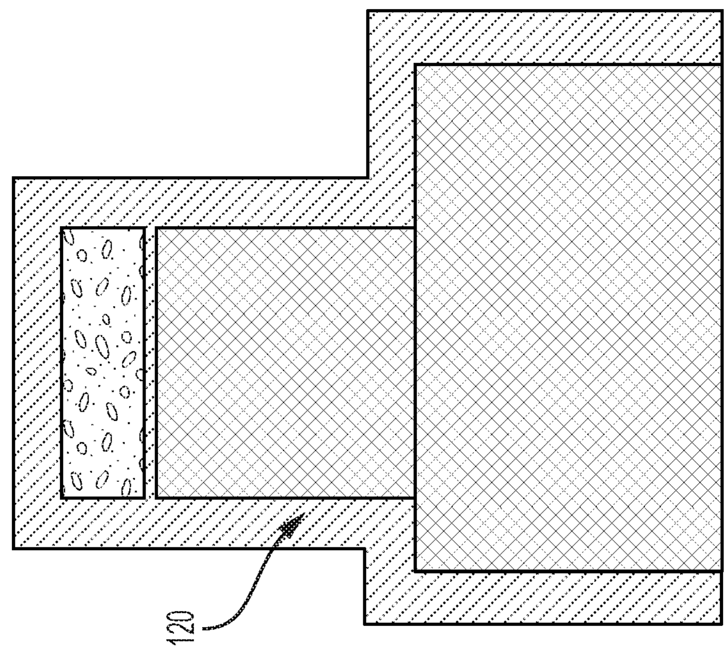
FIG. 3 depicts a cross-sectional view of the semiconductor structure after a processing operation according to one or more embodiments of the present invention.

FIG. 3 depicts a cross-sectional view of the semiconductor structure after a processing operation according to one or more embodiments of the invention. As depicted in FIG. 3, a dielectric liner 120 can be conformably deposited on the structure.

The dielectric liner 120 can include for example, silicon oxide, silicon nitride, silicon oxynitride, a low-k material, or a combination. The low-k material can be a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. The dielectric liner 120 can be formed by an isotropic deposition method.

Figure 4:
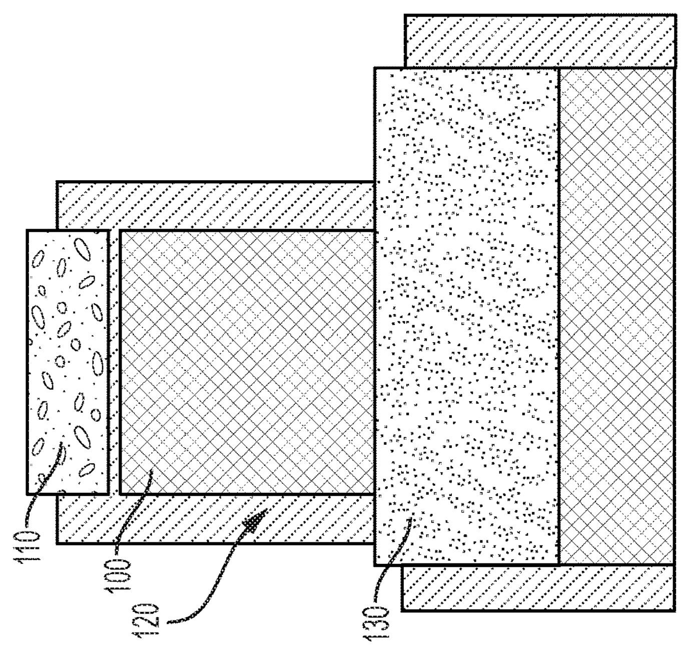
FIG. 4 depicts a cross-sectional view of the semiconductor structure after a processing operation according to one or more embodiments of the present invention.

FIG. 4 depicts a cross-sectional view of the semiconductor structure after a processing operation according to one or more embodiments of the invention. As depicted in FIG. 4, a doped bottom S/D region 130 can be formed and the dielectric liner 120 can be removed from planar surfaces of the semiconductor structure, for example, by ME. In some embodiments of the invention, the doped bottom S/D region 130 can be formed prior to the deposition of dielectric liner 120 or prior to the removal of the dielectric liner 120 from planar surfaces of the semiconductor structure.

Figure 5:
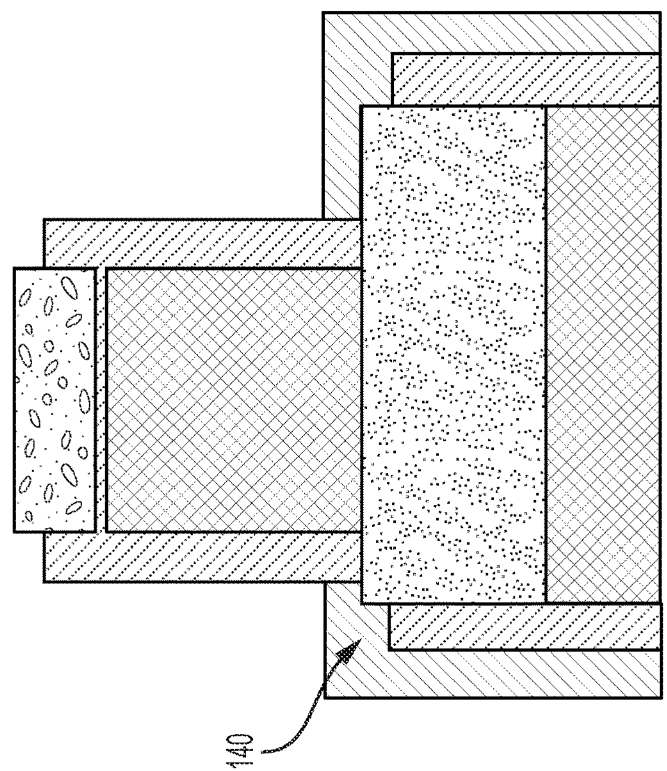
FIG. 5 depicts a cross-sectional view of the semiconductor structure after a processing operation according to one or more embodiments of the present invention.

FIG. 5 depicts a cross-sectional view of the semiconductor structure after a processing operation according to one or more embodiments of the invention. As depicted in FIG. 5, STI structure 140 can be formed. Etching, e.g., fin reveal etching, can be performed. The etching can be a directional etching or timed wet etching. In some embodiments, STI structure 140, e.g., an upper surface of STI structure 140, can be above bottom S/D region 130, e.g., an upper surface of bottom S/D region 130.

STI structure 140 can be filled with a dielectric material such as silicon oxide. A chemical vapor deposition process such as high density plasma chemical vapor deposition (HDPCVD) or PECVD can be employed to deposit the dielectric material into STI structure 140.

In some embodiments of the invention, the dielectric liner 120 can include a different material from the STI structure 140. For example, the dielectric liner 120 can be selective to the dielectric material filling the STI structure 140, e.g., the dielectric liner 120 can have an etch selectivity relative to the dielectric material filling the STI structure 140.

Figure 6:
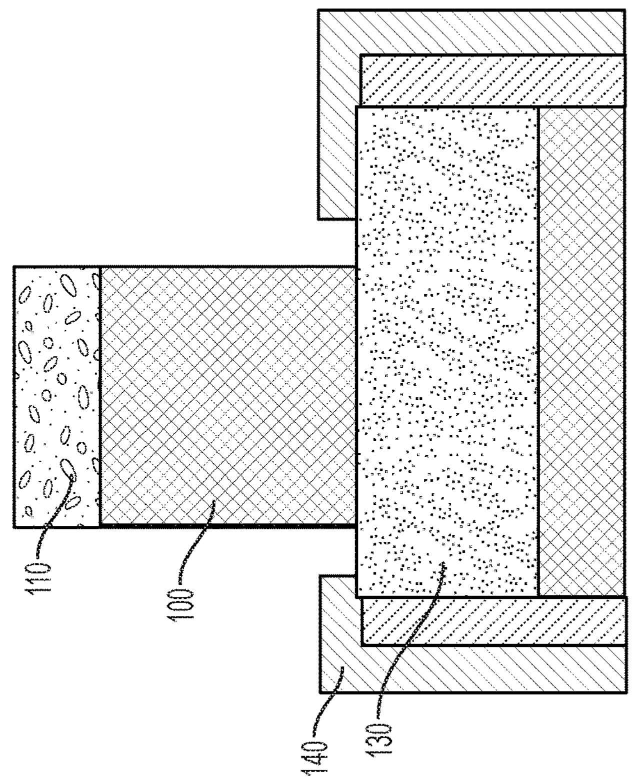
FIG. 6 depicts a cross-sectional view of the semiconductor structure after a processing operation according to one or more embodiments of the present invention.

FIG. 6 depicts a cross-sectional view of the semiconductor structure after a processing operation according to one or more embodiments of the invention. As depicted in FIG. 6, exposed dielectric liner material 120 around the fin 100 can be selectively removed.

Figure 7:
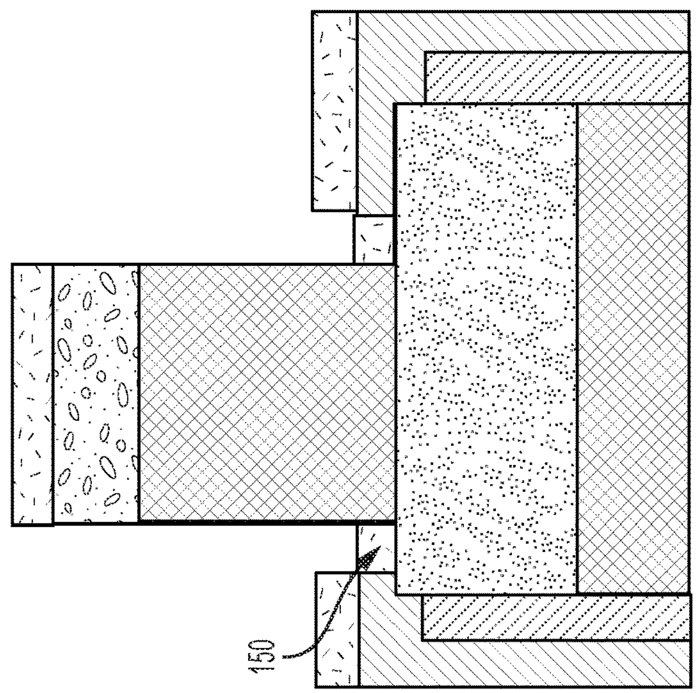
FIG. 7 depicts a cross-sectional view of the semiconductor structure after a processing operation according to one or more embodiments of the present invention.

FIG. 7 depicts a cross-sectional view of the semiconductor structure after a processing operation according to one or more embodiments of the invention. As depicted in FIG. 7, a bottom spacer 150 can be deposited.

The bottom spacer 150 can be formed by performing a directional deposition process such as, for example, a high-density plasma (HDP) process or a Gas Cluster Ion Beam (GCIB) process. The GCIB process is a deposition process that can be highly directional in nature. For example, the directional deposition process can result in the deposition of the bottom spacer 150 on the horizontally oriented surfaces of the device, such as the upper surface of the hard mask layer 110, upper surfaces of the STI structure 140, and exposed portions of the doped bottom source/drain (S/D) region 130, while avoiding deposition of any substantial amount of the bottom spacer 150 on the vertically-oriented surfaces of the device, such as sidewalls of the fins 100 or the hard mask layer 110.

The bottom spacer 150 can include for example, silicon oxide, silicon nitride, silicon oxynitride, a low-k material, or a combination. The low-k material can be a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof. In some embodiments of the invention, the bottom spacer 150 can include a same material as the dielectric liner 120.

Figure 8:
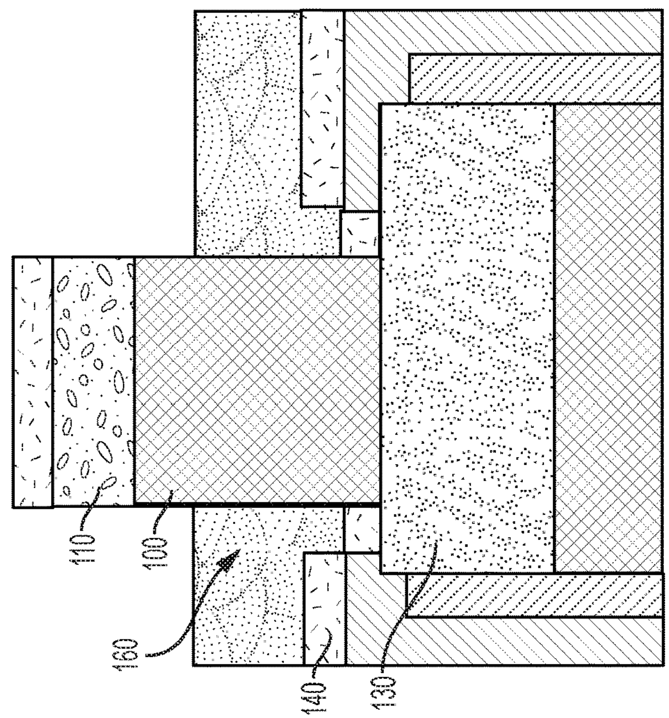
FIG. 8 depicts a cross-sectional view of the semiconductor structure after a processing operation according to one or more embodiments of the present invention.

FIG. 8 depicts a cross-sectional view of the semiconductor structure after a processing operation according to one or more embodiments of the invention. As depicted in FIG. 8, metal gate stack 160 can be formed. Formation of the metal gate stack 160 can occur in one of a variety of different manners, include operations of deposition, CMP, and recess-etching.

Figure 9:
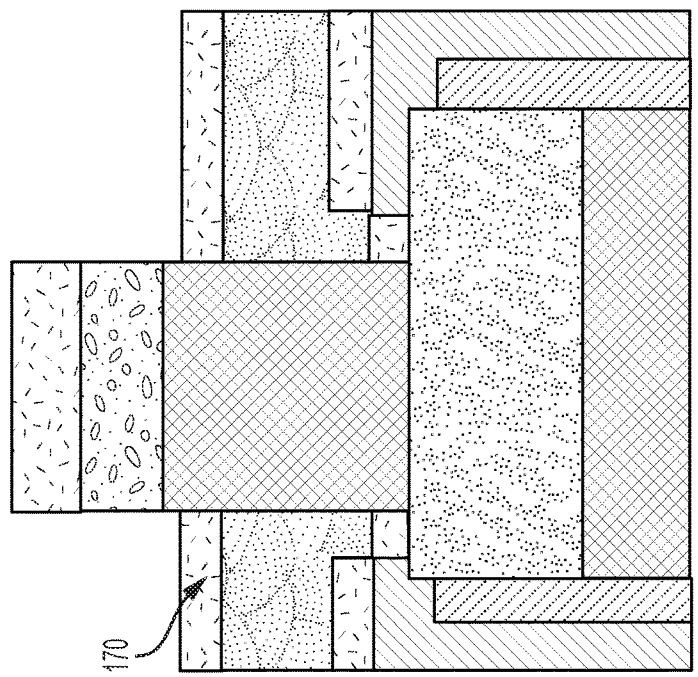
FIG. 9 depicts a cross-sectional view of the semiconductor structure after a processing operation according to one or more embodiments of the present invention.

FIG. 9 depicts a cross-sectional view of the semiconductor structure after a processing operation according to one or more embodiments of the invention. As depicted in FIG. 9, top spacer 170 can be deposited by a directional deposition process, for example, HDP or GCIB. The directional deposition process can result in the deposition of the top spacer 170 on the horizontally oriented surfaces of the device, such as an upper surface of the bottom spacer 150 on top of the hardmask 110 and upper surfaces of the metal gate stack 160, while avoiding deposition of any substantial amount of the top spacer 170 on the vertically-oriented surfaces of the device, such as sidewalls of the fins 100 or the hard mask layer 110.

The top spacer 170 can include for example, silicon oxide, silicon nitride, silicon oxynitride, a low-k material, or a combination. The low-k material can be a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof.

Figure 10:
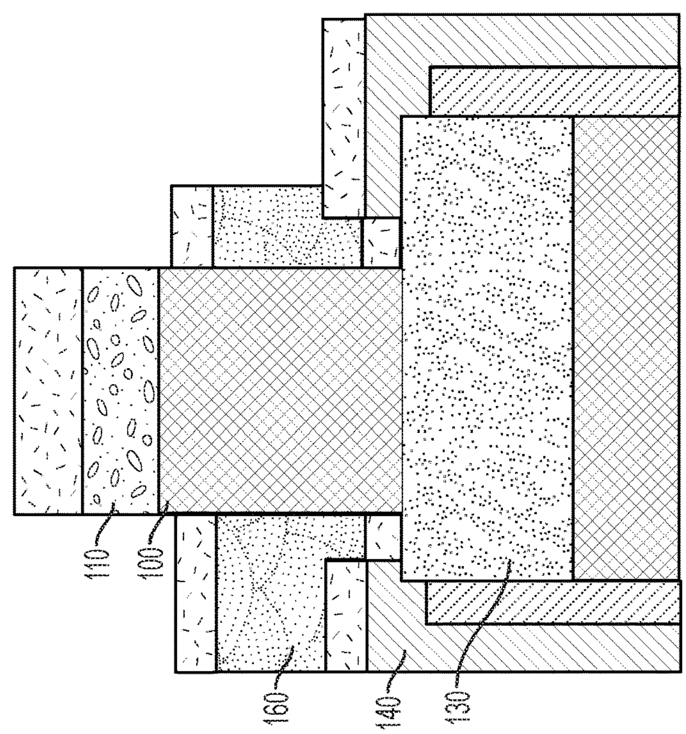
FIG. 10 depicts a cross-sectional view of the semiconductor structure after a processing operation according to one or more embodiments of the present invention.

FIG. 10 depicts a cross-sectional view of the semiconductor structure after a processing operation according to one or more embodiments of the invention. As depicted in FIG. 10, the metal gate stack 160 can be cut.

Figure 11:
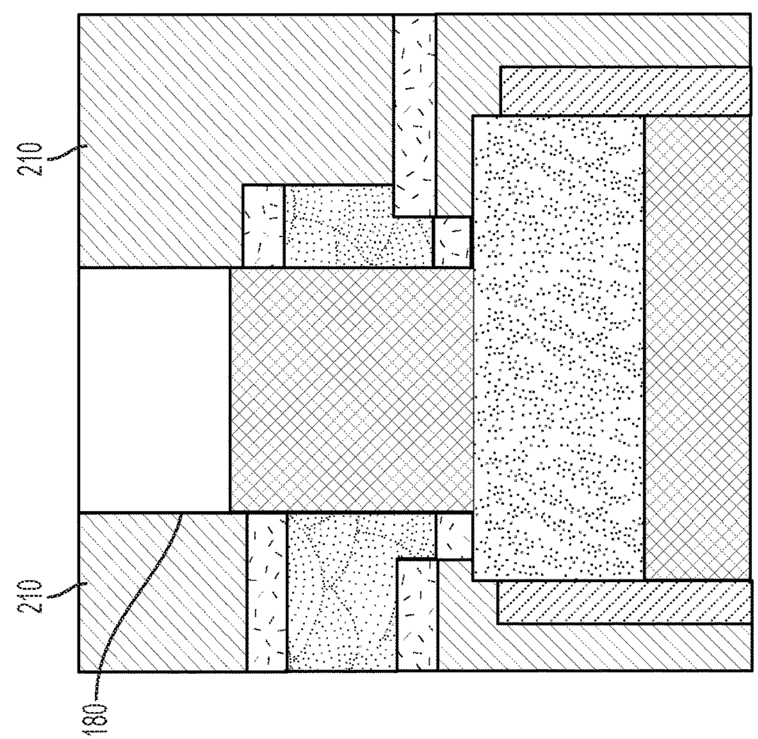
FIG. 11 depicts a cross-sectional view of the semiconductor structure after a processing operation according to one or more embodiments of the present invention.

FIG. 11 depicts a cross-sectional view of the semiconductor structure after a processing operation according to one or more embodiments of the invention. As depicted in FIG. 11, the structure can be coated with a dielectric material 210. A doped top S/D region 180 can be formed, e.g., after removing the bottom spacer 150 and the hard mask layer 110 from a top, e.g., uppermost, surface of fin 100.

In some embodiments of the invention, dielectric material 210 can be, for example, an oxide such as a silicon oxide. A CMP process can be utilized to remove excess portions of dielectric material 210. Additional down-stream processing steps can be performed, for example, formation of contacts, e.g., top contact 190, bottom contact 195, and gate contact 200, and the semiconductor structure can be provided.

With further reference to FIG. 1, the semiconductor fin 100 can be formed on the bottom source/drain region 130 in a first direction, e.g., y-direction, and the dielectric material filling the STI structure 140 can be between the bottom source/drain region 130 and the bottom spacer 150 in the first direction. The bottom source/drain region 130 can have a surface closer to the metal gate stack 160 than does the dielectric liner 120 in the first direction.

The dielectric material filling the STI structure 140 formed along sidewalls of the dielectric liner 120 can be formed on a surface of the bottom source/drain region 130 in a second direction, e.g., x-direction, the second direction being orthogonal to the first direction. The bottom contact 195 can contact bottom source/drain region 130 and the dielectric liner 120 that is along sidewalls of bottom source/drain region 130.

The dielectric liner 120 can be between the bottom source/drain region 130 and the dielectric material filling the STI structure 140 in a first direction, e.g., x-direction, and the bottom source/drain region 130 can have a surface closer to the metal gate stack 160 than does the dielectric liner 120 in the first direction, the second direction being orthogonal to the first direction.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of embodiments of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor structure, comprising:

a source/drain region;

a semiconductor fin on the source/drain region in a first direction;

a first dielectric material in a shallow trench isolation region;

a spacer layer on the source/drain region and on first dielectric material, the first dielectric material being between the source/drain region and the spacer layer in the first direction; and a gate material on the spacer layer and along sidewalls of the semiconductor fin;

a liner on sidewalls of the semiconductor fin and on sidewalls of the source/drain region;

wherein the source/drain region has a surface closer to the gate material than does the liner.

2. The semiconductor structure of claim 1, wherein:

the first dielectric material is on a surface of the source/drain region in a second direction; and the second direction is orthogonal to the first direction.

3. The semiconductor structure of claim 1, wherein the spacer layer on the source/drain region is along sidewalls of the semiconductor fin.

4. The semiconductor structure of claim 1, wherein the spacer layer includes a second dielectric material.

5. The semiconductor structure of claim 4, wherein the second dielectric material is a same material as the first dielectric material.

6. The semiconductor structure of claim 1, wherein the source/drain region has a surface closer to the gate material than does the first dielectric material in the first direction.

7. The semiconductor structure of claim 1, further comprising a contact to the source/drain region, the contact contacting the liner.

8. The semiconductor structure of claim 1, further comprising a contact coupled to the gate material.

9. The semiconductor structure of claim 1, further comprising a top source/drain region contacting the semiconductor fin.

10. The semiconductor structure of claim 9, further comprising a contact coupled to the top source/drain region material.

11. A semiconductor structure, comprising:

a source/drain region;

a first dielectric material;

a liner including a second dielectric material between the source/drain region and the first dielectric material; and a gate region over the source/drain region and the first dielectric region; wherein:

the liner including the second dielectric material is between the source/drain region and the first dielectric material in a first direction; and the source/drain region has a surface closer to the gate region than does the liner including the second dielectric material in a second direction that is orthogonal to the first direction.

12. The semiconductor structure of claim 11, further comprising a contact to the source/drain region, the contact to the source/drain region contacting the liner.

13. The semiconductor structure of claim 11, the first dielectric material has an etch selectivity relative to the second dielectric material.

14. The semiconductor structure of claim 11, further comprising a contact formed against a gate material.

15. The semiconductor structure of claim 11, further comprising a spacer layer on the first dielectric material and portions of the source/drain region.

16. The semiconductor structure of claim 11, further comprising a contact coupled to the gate material.

17. The semiconductor structure of claim 11, further comprising a top source/drain region contacting the semiconductor fin.

18. The semiconductor structure of claim 17, further comprising a contact coupled to the top source/drain region material.

* * * * *